(12) United States Patent
Baldwin et al.

(10) Patent No.: US 7,960,714 B2
(45) Date of Patent: Jun. 14, 2011

(54) INTERFERING EXCITATIONS IN FQHE FLUIDS

(75) Inventors: Kirk William Baldwin, Murray Hill, NJ (US); Loren N. Pfeiffer, Harding Township, Morris County, NJ (US); Kenneth William West, Mendham Township, Morris County, NJ (US); Robert L Willett, Warren, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 218 days.

(21) Appl. No.: 12/317,436

(22) Filed: Dec. 23, 2008

(65) Prior Publication Data
US 2010/0155697 A1 Jun. 24, 2010

Related U.S. Application Data

(60) Provisional application No. 61/201,717, filed on Dec. 12, 2008.

(51) Int. Cl.
*H01L 43/06* (2006.01)
*H01L 43/14* (2006.01)
(52) U.S. Cl. ............ 257/14; 257/E43.003; 257/E43.007
(58) Field of Classification Search ............... 257/14, 257/E43.003, E43.007
See application file for complete search history.

(56) References Cited

U.S. PATENT DOCUMENTS

| 7,394,092 | B2 * | 7/2008 | Freedman et al. ............... 257/14 |
| 7,576,353 | B2 * | 8/2009 | Diduck et al. .................. 257/29 |
| 7,781,801 | B2 * | 8/2010 | Willett .......................... 257/192 |
| 2008/0073668 | A1 * | 3/2008 | Willett .......................... 257/192 |

OTHER PUBLICATIONS

Pan, W. et al, "Fractional Quantum Hall Effect of Composite Fermions", available online at: http://arXiv.org.abs.cond-mat/0303429v1 [cond-mat.mes-hall], Mar. 20, 2003, 7 pgs.
Baldwin, K.W. et al, "Quantum Well Device", Filing Date: May 28, 2010, U.S. Appl. No. 12/789,987, 20 pgs.
Willett, R.L. et al., "Observation of an evan-denominator quantum number in the fractional quantum Hall Effect", Phys Rev. Letters, vol. 59, No. 15, Oct. 1987, pp. 1776-1779.
Moore, G. et al, "Nonabelions In The Fractional Quantum Hall Effect", Nuclear Physics B, vol. 360, Issue 2-3, pp. 362-396, (1991).
Haldane, F.D.M., et al, "Spin-singlet wave function for the half-integral quantum Hall effect", Phys. Rev. Lett., vol. 60, No. 10, Mar. 1998, pp. 956-959.
Das Sarma, S. et al, "Topologically Portected Qubits from a Possible Non-Abelian Fractional Quantum Hall State", Phys. Rev. Lett. 94, (Apr. 2005) pp. 166802-1-166802-4.

(Continued)

*Primary Examiner* — Victor Mandala
(74) *Attorney, Agent, or Firm* — John F. McCabe (57) ABSTRACT

An apparatus includes a substrate with a planar surface, a multilayer of semiconductor layers located on the planar surface, a plurality of electrodes located over the multilayer, and a dielectric layer located between the electrodes and the multilayer. The multilayer includes a 2D quantum well. A first set of the electrodes is located to substantially surround a lateral area of the 2D quantum well. A second set of the electrodes is controllable to vary a lateral width of a non-depleted channel between the substantially surrounded lateral area of the 2D quantum well and another area of the 2D quantum well. A third set of the electrodes is controllable to vary an area of a non-depleted portion of the lateral area.

13 Claims, 10 Drawing Sheets

OTHER PUBLICATIONS

Stern, A. et al, "Proposed Experiments to Probe the Non-Abelian v=5/2 Quantum Hall State", Phys. Rev. Lett. 96 (2006), pp. 016802-1-016802-4.
Bonderson, P. et al, "Detecting Non-Abelian Satistics in the v=5/2 Fractional Quantum Hall State", Phys. Rev. Lett. 96, (Jan. 2006), pp. 016803-1-016803-4.
Van Loosdrecht, P. et al, "Aharonov-Bohm effect in a singly connected point contact", Phys. Rev. B, vol. 38, No. 14, (Nov. 1988), pp. 10162-10165.
Van Wees, B.J. et al, "Observation of Zero-Dimensional States in a One-Dimensional Electron Interferometer", Phys. Rev. Lett. vol. 62, No. 21, May 22, 1989, pp. 2523-2526.
Ji, Y. et al, "An electronic Mach-Zehnder Interferometer", Nature, vol. 422, Mar. 27, 2003, pp. 415-418.
Roulleau, P. et al, "Direct Measurement of the Coherence Length of Edge States in the Integer Quantum Hall Regime", Phys. Rev. Lett. 100, (2008) pp. 126802-1-126802-4.
Camino, F.E. et al, "Aharonov-Bohm Superperiod in a Laughlin Quasiparticle Interferometer", Phys. Rev. Lett. 95, Dec. 9, 2005, pp. 246802-1-246802-4.
Godfrey, M.D. et al, "Aharanov-Bohm Oscillations in Quantum Hall Corrals", available on line at: http://arxiv.org/abs/0708.2448v1, (2007), 5 pgs.
Willett, R.L. et al, "Confinement of fractional quantum Hall states in narrow conducting channels", Appl. Phys. Lett. 91, (2007) pp. 052105-1-052105-3.
Rosenow, B. et al, "Influence of Interactions on Flux and Back-Gate Period of Quantum Hall Interferometers", Phys. Rev. Lett. 98, Mar. 2007, pp. 106801-1-106801-4.
Beenaker, C.W. et al, "Quantum Transport in Semiconductor Nanostructures", Solid State Physics, Henry Ehrenreich and David Turnbull,eds., vol. 44, 1991, pp. 1-228.
Dolev, M. et al "Observation of a quarter of an electron charge at the v=5/2 quantum Hall state", vol. 452, Apr. 17, 2008, pp. 829-834.
Radu, I. et al, "Quasi-Particle Properties from Tunneling in the v-5/2 fractional Quantum Hall State", Science, vol. 320, May 16, 2008, pp. 899-902.
Chamon, C. de C. et al, "Two point-contact interferometer for quantum hall systems", Phys. Rev. B, vol. 55, No. 4, Jan. 1997, pp. 2331-2343.
Fradkin, E. et at, "a Chern-Simons effective field theory fro the Pfaffian quantum Hall state", Nucl. Phys. B 516, Jan. 1998, pp. 704-718.
Davies, J. "The Physics Of Low-Dimensional Semiconductors An Introduction", 1998, Title, copyright, vii-xi, pp. 80-117, 118-149, 206-248, 329-370.,Cambridge Univ Press, UK.
R.L. Willett et al., "Confinement of fractional quantum Hall states in narrow conducting channels", *Applied Physics Letters 91* (2007), pp. 052105-1-052105-3.
Ady Stern, et at., "Proposed Experiments to Probe the Non-Abelian v=5/2 Quantum Hall State", *Physical Review Letters 96* (2006), pp. 016802-1-016802-4.
S. Das Sarma et al., "Topologically Protected Qubits from a Possible Non-Abelian Fractional Quantum Hall State", Physical Review Letters 94 (2005), pp. 166802-1-166802-4.
"Composite Fermions: A Unified View of the Quantum Hall Regime", edited by O. Heinonen, World Scientific, Singapore, 1998, Title, copyright, v-xi, pp. 1-491.

* cited by examiner

FIG. 7

INTERFERING EXCITATIONS IN FQHE FLUIDS

This application claims the benefit of U.S. provisional patent application No. 61,201,717, titled "DEVICES FOR INTERFERING EXCITATIONS IN FQHE FLUIDS", which was filed Dec. 12, 2008 by Kirk W. Baldwin, Loren N. Pfeiffer, Kenneth W. West, and Robert L. Willett.

BACKGROUND

1. Technical Field

The invention relates to generally to semiconductor electronic devices and, more particularly, to apparatus and methods for manipulating excitations in quantum fluids.

2. Discussion of the Related Art

This section introduces aspects that may be helpful to facilitating a better understanding of the inventions. Accordingly, the statements of this section are to be read in this light and are not to be understood as admissions about what is prior art or what is not the prior art.

The fractional quantum Hall effect (FQHE) produces a set of special equilibrium states with curious properties. The properties are believed to be caused by collective effects between the charge carriers in strong external magnetic fields. The special equilibrium states occur at special partial filling values for the magnetic Landau levels produced by the external magnetic field. In the special equilibrium states, a trapped two-dimensional charge carrier gas is believed to behave as an incompressible fluid droplet, and current conduction by such a gas is believed to occur via excitations on the edge(s) of the fluid droplet.

There is interest in the FQHE, because this system may provide an advantageous realization of a quantum computer. In particular, some FQHE systems may have multi-excitation states that obey nonabelian statistics. The nonabelian statistics of such multi-excitation states are believed to be related to topological quantum numbers. For that reason, it may be useful to use such multi-excitation states to represent the states of a qubit in a quantum computer. Indeed, the topological nature of the nonabelian statistics could protect such multi-excitation states from being changed by perturbations in such physical systems. For that reason, using such topological states to represent the states of a qubit could enable a realization of quantum computers in which the susceptability to calculation errors is orders of magnitude lower than those expected in other realizations of quantum computers.

SUMMARY

One embodiment is an apparatus that includes a substrate with a planar surface, a multilayer of semiconductor layers located on the planar surface, a plurality of electrodes located over the multilayer, and a dielectric layer located between the electrodes and the multilayer. The multilayer includes a 2D quantum well. A first set of the electrodes is located to substantially surround a lateral area of the 2D quantum well. A second set of the electrodes is controllable to vary a lateral width of a non-depleted channel between the substantially surrounded lateral area of the 2D quantum well and another area of the 2D quantum well. A third set of the electrodes is controllable to vary an area of a non-depleted portion of the lateral area.

In some embodiments of the apparatus, the plurality of electrodes includes, at least, two point-like electrodes.

In some embodiments of the apparatus, the second set of the electrodes can back scatter an edge current propagating along one edge of a FQHE droplet to an opposite edge of said FQHE droplet.

In some embodiments of the apparatus, a fourth set of the electrodes is located to substantially surround a second lateral area of the 2D quantum well. The two lateral areas are disjoint. Some of the electrodes are controllable to vary a lateral width of a non-depleted channel between the two lateral areas.

In some embodiments of the apparatus, the electrodes include one point-like electrode located in each of the lateral areas. In such embodiments, the electrodes may include a bridge electrode located between the point-like electrodes and between a pair of gating electrodes. The bridge electrode may be operable to transport a localized FQHE excitation between the point-like electrodes. The bridge electrode may be operable to transport a localized FQHE excitation between the point-like electrodes. The bridge electrode may include a plurality of electrodes between the point-like electrodes.

In some embodiments of the apparatus, the 2D quantum well includes AlGaAs barrier layers and a GaAs well layer located between the barrier layers.

In some embodiments of the apparatus, a well layer and adjacent portions of the barrier layers of the 2D quantum well are substantially undoped.

One embodiment is a method that includes localizing a first charged quasiparticle excitation at a first electrode located in a first confined portion of a FQHE droplet and includes transferring a second charged quasiparticle excitation from the first electrode to a second electrode located in a second disjoint confined portion of the FQHE droplet. The transferring is performed by moving the second charged quasiparticle excitation from the first electrode to a bridging electrode and by moving the second quasiparticle excitation from the bridging electrode to the second electrode.

Some embodiments of the method include transferring another quasiparticle excitation between two edges of the FQHE droplet by moving the another quasiparticle excitation from one edge of the FQHE droplet to the bridging electrode and then, moving the another quasiparticle excitation from the bridging electrode to the second edge of the FQHE droplet.

In some embodiments of the method, the FQHE droplet is formed of charge carriers confined to a 2D quantum well. The 2D quantum well may be substantially undoped in a well layer thereof and be doped in one or more barrier layers thereof. The 2D quantum well may have upper and lower barrier layers and a well layer located therebetween, wherein each barrier layer includes adjacent first and second sublayers of different semiconductor alloys. The 2D quantum well may be an AlGaAs/GaAs/AlGaAs quantum well that is substantially undoped in a GaAs well layer thereof and is doped in one or more AlGaAs barrier layers thereof.

In some embodiments of the method, the transferring may include moving the second charged quasiparticle excitation between two bridging electrodes.

BRIEF DESCRIPTION OF THE FIGURES

In the Figures and text like reference numbers refer to functionally similar elements.

In the Figures, the relative dimensions of some features may be exaggerated to more clearly illustrate apparatus therein.

Herein, various embodiments are described more fully by the Figures and the Detailed Description of Illustrative Embodiments. Nevertheless, the inventions may be embodied in various forms and are not limited to the specific embodiments described in the Figures and the Detailed Description of the Illustrative Embodiments.

DESCRIPTION OF THE ILLUSTRATIVE EMBODIMENTS

U.S. provisional patent application No. 61/201,717, titled "DEVICES FOR INTERFERING EXCITATIONS IN FQHE FLUIDS", which was filed Dec. 12, 2008 by Kirk W. Baldwin, Loren N. Pfeiffer, Kenneth W. West, and Robert L. Willett is incorporated herein by reference in its entirety.

Figure 1:
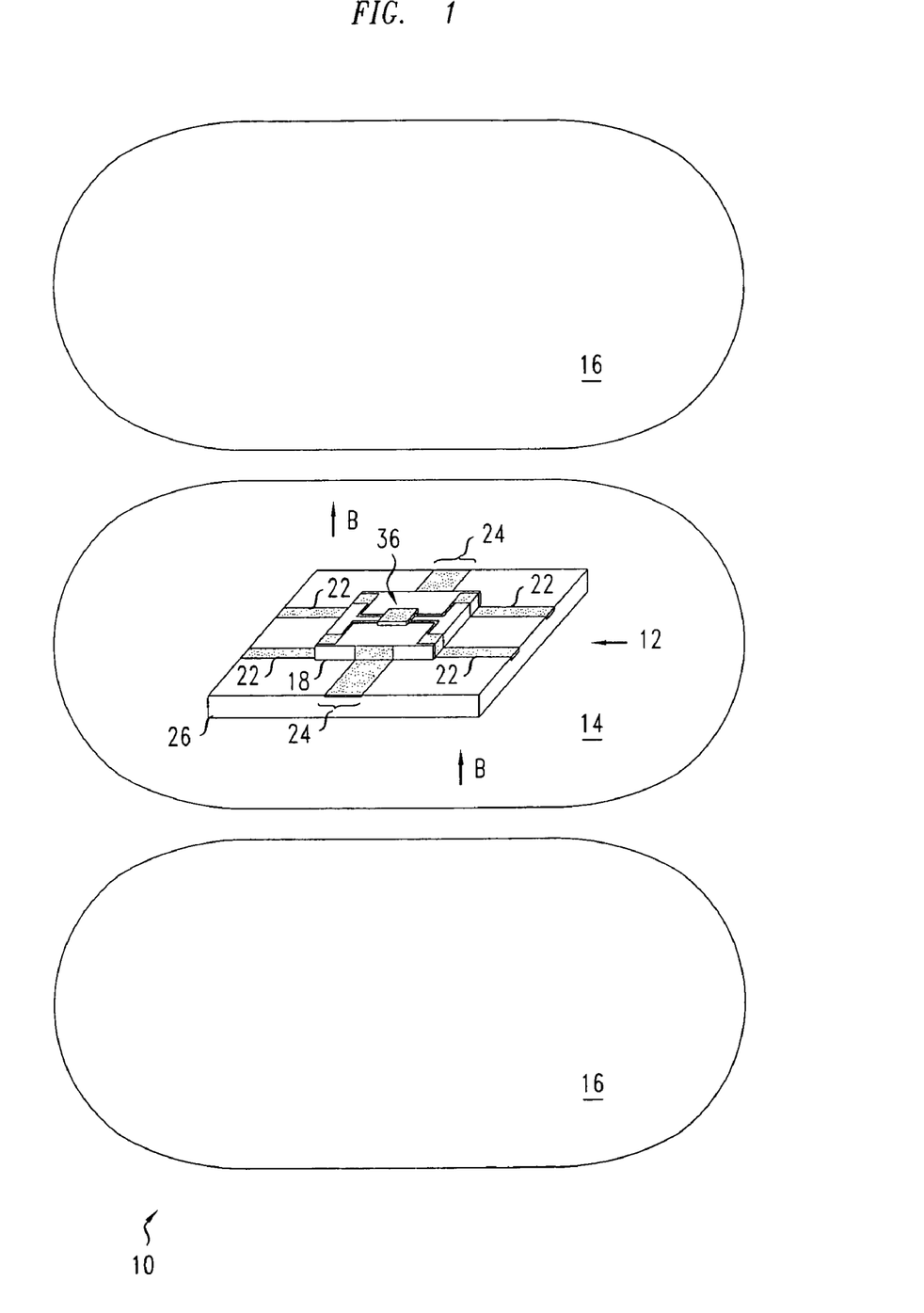
FIG. 1 is an oblique view that schematically illustrates a setup for maintaining and manipulating excited states in a FQHE fluid.

FIG. 1 illustrates a setup 10 for manipulating excited states of a FQHE fluid. Some embodiments of the apparatus 10 may be used to interfere edge excitations of a FQHE droplet. Some embodiments of the apparatus 10 may be used to produce, change, and/or check the value of a qubit, e.g., in a quantum computer whose qubit states are excited current-carrying states of a FQHE droplet.

In some embodiments, the apparatus 10 can manipulate excitations of FQHE fluids at filling factors of 5/2 or 12/5 for Landau levels of an external magnetic field, B. In such embodiments, the apparatus 10 can manipulate states whose excitations obey a nonabelian or topological statistics.

The setup 10 includes a semiconductor device 12, a low-temperature cooling system 14, and a magnet 16.

The semiconductor device 12 includes a planar structure 18, current carrying and voltage measurement leads 22, and electrical control leads 24. The planar structure 18 is located on a crystalline substrate 26. The planar structure 18 includes a 2D quantum well structure for trapping a 2D charge-carrier gas (2DCCG). The planar structure 18 also includes top electrodes 36 for laterally confining a portion of an incompressible FQHE droplet of the 2DCCG and for manipulating edges and excitations of said FQHE droplet.

The low-temperature cooling system 14 is able to cool the planar structure 18 to temperatures low enough to produce desired FQHE states, e.g., at filling factors of 5/2 or 12/5. In particular, the low-temperature cooling system 14 can cool the planar structure to temperatures below 150 milli-Kelvin (mK), e.g., 50 mK to 150 mK; preferable below 100 mK, e.g., 100 mK to about 50 mK; and maybe below 50 mK, e.g., about 20 mK. The low-temperature cooling system 14 may include, e.g., a $He^3$, $He^4$ dilution refrigerator.

The magnet 16 can produce a uniform and moderately strong external magnetic field, B, near the planar structure 18, e.g., a field, B, whose magnitude is about 5 Tesla or more. The produced external magnetic field, B, is large enough to generate desired FQHE states in the planar structure 18, e.g., states in which the Landau levels of the field B are filled to a filling factor of 5/2 or 12/5.

The current carrying and voltage measurement leads 22 carry currents and enable voltage measurements on the 2DCCG in the planar structure 18, e.g., in a conventional 4-terminal arrangement. The control leads 24 enable depletion of selected lateral regions of the 2D quantum well of the planar structure 18 of charge carriers so that a FQHE droplet of the 2DCCG can be laterally confined and manipulated in the 2D quantum well.

Herein, depletion will refer to a condition where a region is depleted of charge carriers of a trapped 2DCCG.

Figure 2:
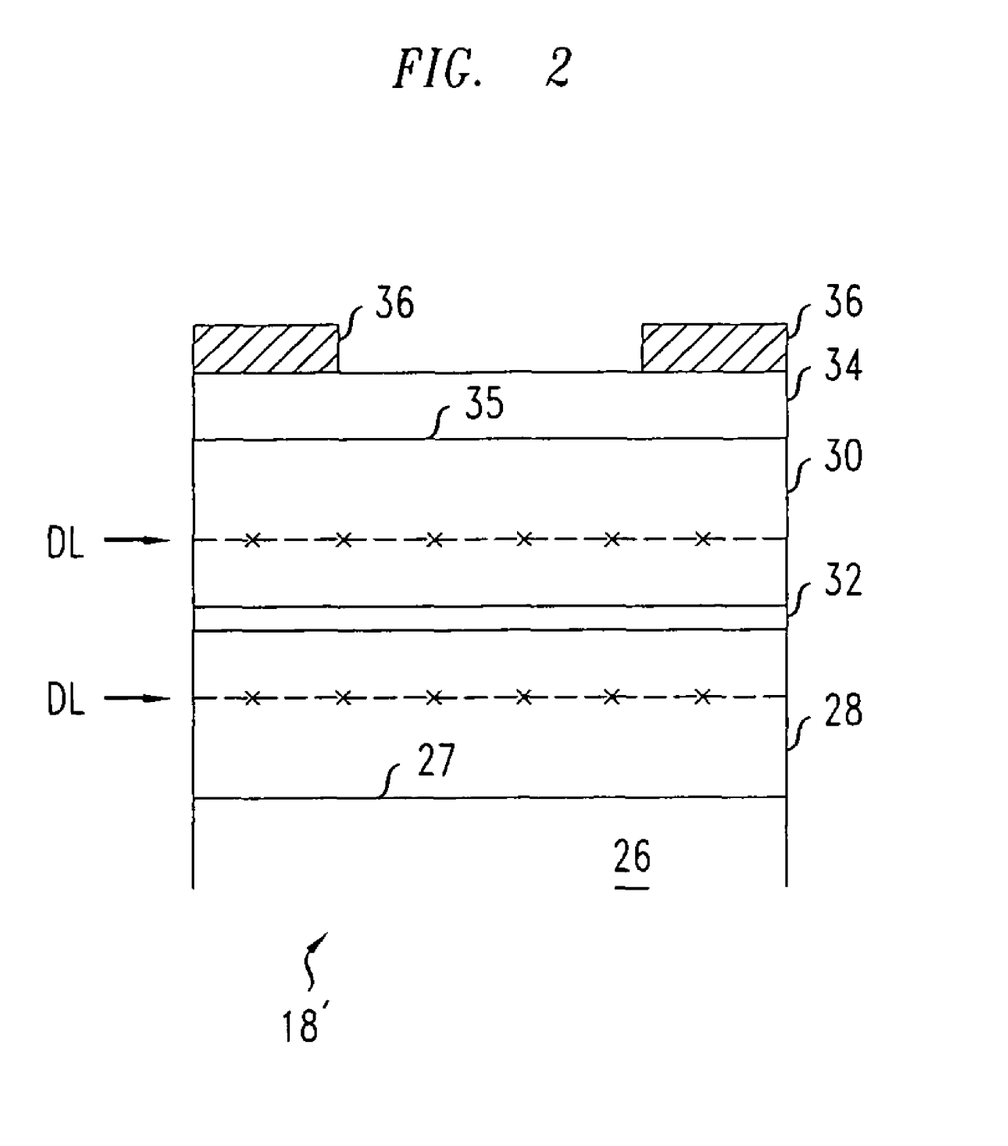
FIG. 2 is a cross-sectional view that schematically illustrates part of a planar structure for maintaining and manipulating excited states of a FQHE fluid in the setup of FIG. 1.

FIG. 2 illustrates one embodiment 18' for the planar structure 18 of FIG. 1. The bottom-to-top layer structure of the planar structure 18' includes a crystalline semiconductor substrate 26, a crystalline lower semiconductor barrier layer 28, a crystalline semiconductor well layer 32, an crystalline upper semiconductor barrier layer 30, a top dielectric layer 34, and top electrodes 36.

The planar structure 18' has a 2D quantum well formed by the crystalline semiconductor barrier layers 28, 30 and the crystalline semiconductor well layer 32. The 2D quantum well is located on a planar top surface 27 of the crystalline semiconductor substrate 26.

The 2D quantum well is doped to have a desired density of charge carriers for a 2DCCG, e.g., electrons, during low-temperature operation.

In some embodiments, the 2D quantum well structure may be modulation doped to reduce undesired perturbations of the trapped 2DCCG. In such embodiments, the dopant atoms are vertically confined to parts of the crystalline semiconductor barrier layers 28, 30 far from the crystalline semiconductor well layer 32. For example, the dopant atoms may be confined to one or two thin dopant layers (DLs) deep in interior(s) of the semiconductor barrier layer(s) 28, 30 as illustrated in FIG. 2. Such a dopant distribution vertically separates the dopant atoms from the crystalline semiconductor well layer 32 and nearby portions of the crystalline semiconductor barrier layers 28, 30 where the 2DCCG is primarily located. Such a vertical separation of the dopant atoms from the 2DCCG enables a partial coulomb shielding of the 2DCCG from the charged ion cores of the dopant atoms. For modulation doping that is restricted to such thin dopant layers (DLs), the ion cores of dopant atoms are expected to less perturb the FQHE states in undesired manners.

A symmetric placement of a dopant layer (DL) on each side of the semiconductor well layer 32, i.e., as illustrated in FIG. 2, enables a larger vertical separation between the ion cores of the dopant atoms and the trapped 2DCCG for the same overall dopant density. Thus, the symmetric vertical distribution may enable a better shielding of the ion cores of the dopant atoms for the same total density of current carriers.

The top dielectric layer 34 electrically insulates the top operating electrodes 36, which are located thereon, from the structures of the underlying 2D quantum well. The top dielectric layer 34 may also reduce the production of traps and other localized defects on top semiconductor surface 35 during fabrication. Such defects can also undesirably perturb the trapped 2DCCG at low temperatures.

The top operating electrodes 36 are laterally located and connected to enable the control and manipulation of a FQHE droplet in the 2DCCG during operation. The top operating electrodes 36 can be operated to vary the area of one or more confined lateral regions of such a FQHE droplet, to back scatter edge excitations on such a FQHE droplet, and/or to cause and control interference of such edge excitations. In some embodiments, such top operating electrodes 36 can even initialize and change the state of a qubit that is represented by the current state of such a FQHE droplet.

Some specific embodiments 18" of the planar structure 18' are based on an epitaxially grown AlGaAs/GaAs/AlGaAs 2D quantum well structure. One such specific planar structure 18" is described below and has a vertical semiconductor alloy structure illustrated in FIG. 3.

The specific planar structure 18" may have the form of a mesa etched from a layer structure epitaxially deposited on a planar top surface 27 of a crystalline substrate 26 of FIGS. 1-2. The mesa may have, e.g., a length of about 0.6 millimeters (mm) and a width of about 0.3 mm. The mesa may provide for electrically connecting to the current carrying and voltage measurement leads 22 and control leads 24 of FIG. 1 via side edges thereof.

In the specific planar structure 18", the crystalline substrate 26 includes a GaAs wafer substrate and a buffer stack of GaAs and/or AlAs layers that are epitaxially grown on a 100 lattice surface of the GaAs wafer substrate. The 100 lattice surface of the GaAs wafer substrate may be polished and/or cleaned by standard techniques prior to the epitaxial growth of the buffer stack thereon. The buffer stack may include a first thick layer of GaAs, e.g., about 50 nm to 200 nm and a stack of alternating GaAs and AlAs layers thereon, e.g., about 600 repetitions of GaAs and AlAs monolayers and/or bilayers. The buffer stack may reduce the undesired effects of surface defects in the GaAs wafer substrate on the quantum well structure fabricated thereon and/or may reduce carrier leakage to the GaAs wafer substrate due to dopants in the quantum well structure. For the relevant distances, such leakage is also probably low, because it probably decreases approximately like an inverse power of the distance between the lower dopant layer DL and the GaAs wafer substrate, e.g., like the power "−1". If such leakage was large, it might otherwise produce a background current that interfered with the identification and manipulation of desired FQHE states.

In the specific planar structure 18", the crystalline semiconductor layers 28, 32, 30 are epitaxially grown on a 100 lattice surface 27 of the crystalline substrate 26 to form the 2D quantum well structure. In the 2D quantum well structure, different layers have different semiconductor alloy compositions, which are produced by varying the relative percentages of aluminum (Al) and gallium (Ga) in the gas mixture during the epitaxial growths. The various semiconductor alloys have forms $Al_xGa_{(1-x)}As$ where the concentration of Al fixes the energy of the lower edge of the conduction band. In particular, the height of the lower edge of the conduction band is believed to be monotonic in the concentration of Al in such alloys. For that reason, the Al percentages of FIG. 3 also qualitatively illustrate the energy topography for electrons that are trapped in the 2D quantum well structure.

Figure 3:
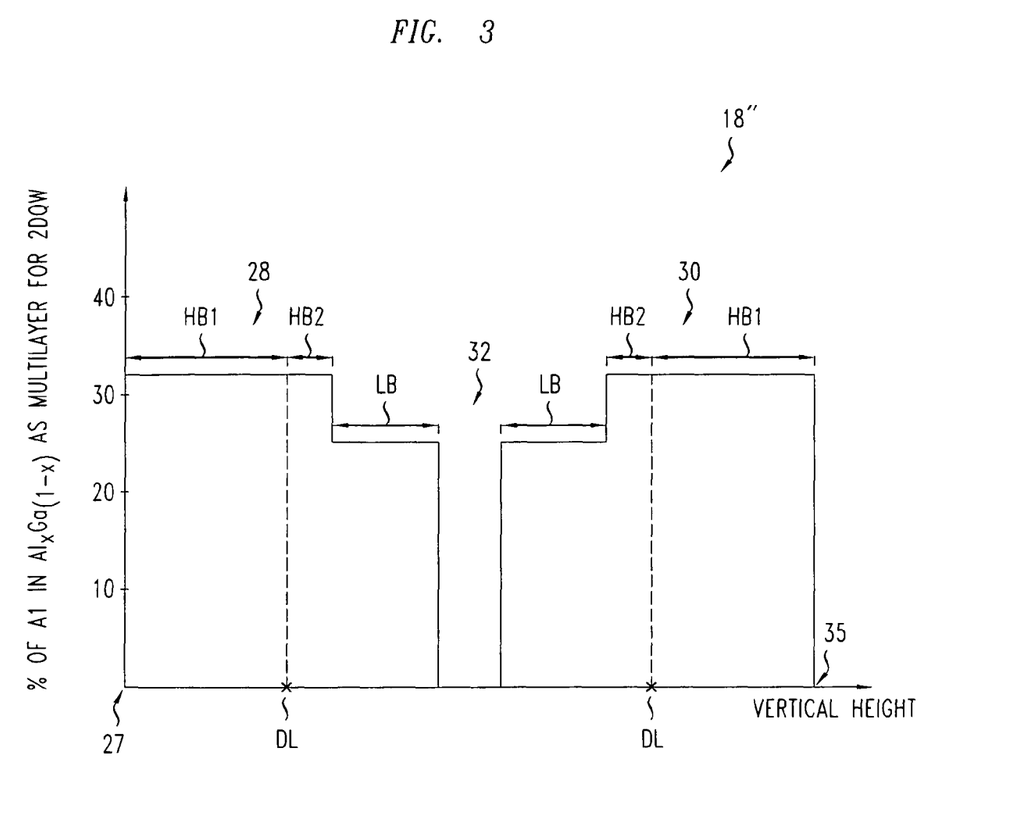
FIG. 3 graphs the aluminum (Al) percentage as a function of vertical depth in an aluminum (Al) gallium (Ga) arsenide (AS) two-dimensional (2D) quantum well structure of one embodiment of the planar structure of FIG. 2.

In the specific planar structure 18", the lower semiconductor barrier layer 28 is a multilayer that is epitaxially grown on the crystalline substrate 26. For this multilayer, the bottom-to-top structure is: an $Al_xGa_{(1-x)}As$ layer, HB1, with an alloy parameter x of about 0.323 and a thickness of about 110 nm; a thin n-type dopant layer (DL) of SiAs, e.g., a fraction of one or a few monolayers; an $Al_xGa_{(1-x)}As$ layer HB2 with an alloy parameter x of about 0.323 and a thickness of about 42 nm; and an $Al_{x'}Ga_{(1-x')}As$ layer LB with an alloy parameter x' of about 0.243 and a thickness of about 48 nm.

The lower Si doped layer DL is located far from the upper surface of the lower semiconductor barrier layer 28 so that dopant ion cores will less perturb the trapped 2DCCG during operation. In example embodiments, the lower DL layer may include about $10^{12}$ dopant atoms per centimeter-squared.

In the specific planar structure 18", the crystalline semiconductor well layer 32 is a substantially undoped GaAs layer with a width of about 24 nm. The crystalline semiconductor well layer 32 is epitaxially grown on crystalline lower semiconductor barrier layer 28.

In the specific planar structure 18", the crystalline upper semiconductor barrier layer 30 is a multilayer that is epitaxially grown on the crystalline semiconductor well layer 32. The crystalline upper semiconductor layer 30 is a multilayer that is substantially a mirror image of the crystalline lower semiconductor layer 28. For this multilayer, the bottom-to-top structure is: an $Al_{x'}Ga_{(1-x')}As$ layer LB with an alloy parameter x' of about 0.243 and a thickness of about 48 nm; an $Al_xGa_{(1-x)}As$ layer HB2 with an alloy parameter x of about 0.323 and a thickness of about 42 nm; a thin n-type dopant layer (DL) of SiAs, e.g., a fraction of one or a few monolayers; and an $Al_xGa_{(1-x)}As$ layer HB1 with an alloy parameter x of about 0.323 and a width of about 110 nm. The upper n-type doped layer DL is vertically separated from the semiconductor well layer 32 so that ion cores of dopant atoms less perturb the trapped 2DCCG.

In example embodiments, the upper Si doped layer DL may also have of order $10^{12}$ dopant atoms per centimeter-squared. But, in the upper Si doped layer DL, the dopant atom density may be about 3 to about 4 times the value of dopant atom density in the lower Si doped layer DL, because the upper Si doped layer DL can also contribute charge carriers that neutralize dangling bonds at the exposed top surface 35 of the 2D semiconductor well structure 18', 18" by combining with atoms thereat.

The crystalline semiconductor well layer 32 is also located, at least, about 200 nm below the top surface of the 2D quantum well structure, e.g., to reduce undesired interactions between the trapped 2DCCG and any localized defects on said top surface.

In the specific planar structure 18", the top dielectric layer 34 is an amorphous dielectric layer. One embodiment of the top dielectric layer 34 is a silicon nitride layer having a thickness of about 40 nm or less.

In the specific planar structure 18", the top operating electrodes 36 may be patterned metallic layers, e.g., formed via conventional deposition and lithographic patterning processes. For example, the top operating electrodes 36 may be formed by an evaporation-deposition of aluminum to a thickness of about 60 nm on a resist patterned substrate followed by a lift off the resist and excess aluminum.

In the specific planar structure 18", the quantum well structure may have a mobility of $28 \times 10^6$ centimeters-squared per volt-second ($cm^2$/V-s) or higher, e.g., $36 \times 10^6$ $cm^2$/V-s. That is, the quantum well structure formed by semiconductor layers 28, 30, 32 may be a high quality structure for trapping a 2DCCG of electrons.

With respect to the planar structures 18', 18" of FIGS. 2-3, the 2D quantum well structure may be doped in a manner that substantially saturates the lowest energy level of the 2D quantum well with charge carriers, i.e., without filling or partially filling any higher energy levels of the 2D quantum well. In the upper dopant layer (DL), the dopant density may be substantially larger than in the lower dopant layer (DL), e.g., about 3 to 4 times as larger, to provide charge carriers that can neutralize dangling bonds at free top semiconductor surface 35 of the planar structures 18', 18". Approximate densities of dopant atoms in the upper and/or lower dopant layers DL can be estimated through numerical calculations of the energy levels of the 2D quantum well structures. To perform such calculations for a 2D quantum well structure, a person of skill in the art may use a publicly available computer program. For example, the program titled "1D Poisson", which is available as freeware at the online site http://www.nd.edu/~gsnider/ of Professor Gregory Snider of the Department of Electrical Engineering, University of Notre Dame, Notre Dame, Ind. 46556 USA, is a useful program for designing the layer structure of such a 2D quantum well structure, e.g., to determine appropriate modulated dopant atom densities therein.

Figure 4A:
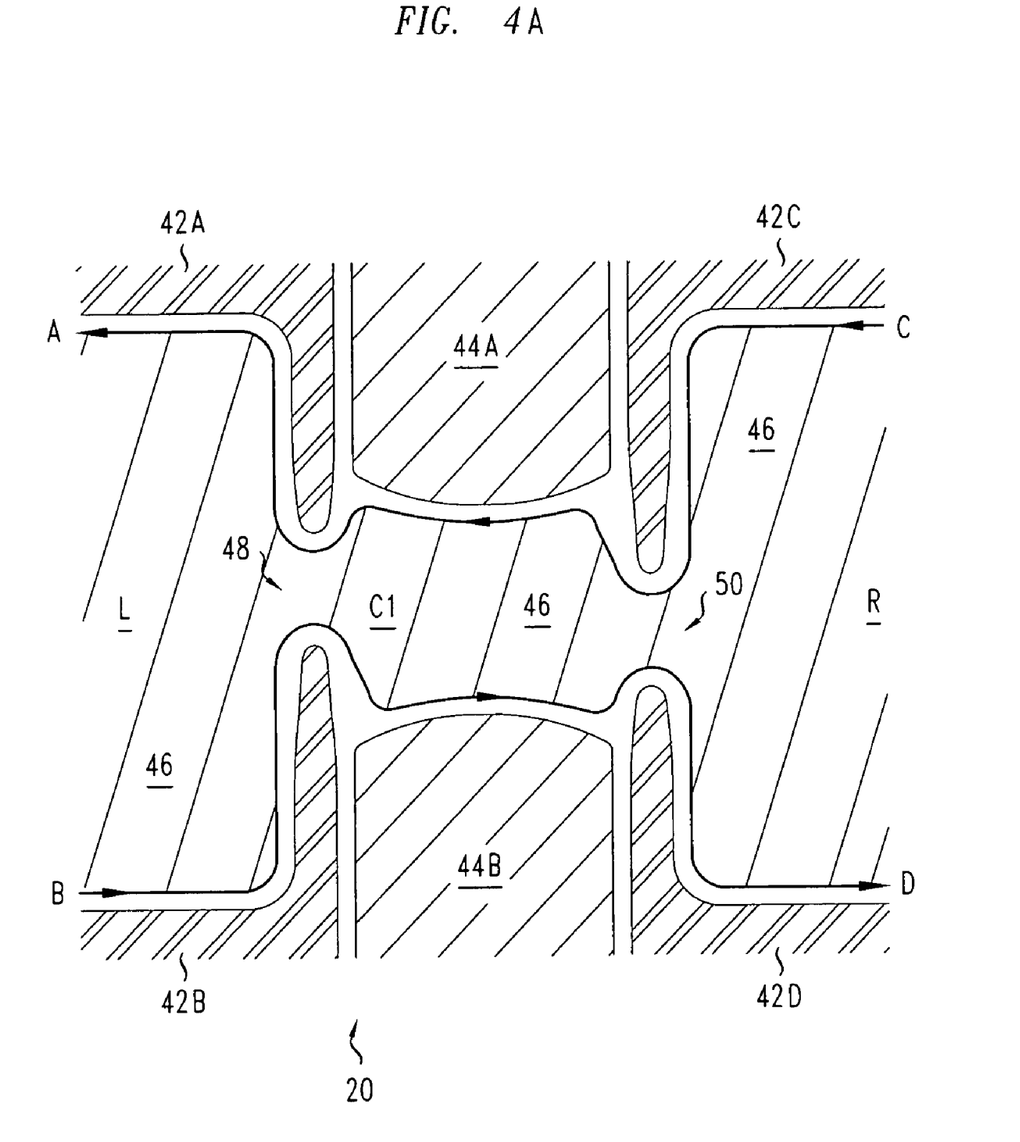
FIG. 4A is a top view of one embodiment of a planar structure for interfering excited states of a FQHE fluid, e.g., with the setup of FIGS. 1-2.

FIG. 4A illustrates a the planar FQHE device 20 based the planar structures 18, 18', 18" of FIGS. 1-3. The planar FQHE device 20 is able to produce and manipulate a laterally confined FQHE droplet 46 of a 2DCCG trapped in a 2D quantum well when the 2DCCG is subject to a strong transverse magnetic field, B, at very low temperatures, e.g., in the setup 10 of FIG. 1. The FQHE droplet 46 has an upper edge whose lateral extent is indicated by a thick smooth line running from C to A in FIG. 4A and has a lower edge whose lateral extent is indicated by a thick smooth line running from B to D in FIG. 4A. The FQHE device 20 controls the lateral edges of the FQHE droplet 46 by voltages applied to two pairs of top channel-gating electrodes (42A, 42B) and (42C, 42D) and one pair of top lateral confining electrodes (44A, 44B).

In particular, the voltages applied to the top electrodes 42A, 42B, 42C, 42D, 44A, 44B can carrier-deplete directly underlying regions of 2D quantum well and regions of the 2D quantum well neighboring such underlying regions. For example, if the applied voltages produce a coulomb potential repulsive for the charge carriers in the 2DCCG trapped in the 2D quantum well, the applied voltages can produce a coulomb potential that laterally confines a droplet of the 2DCCG, e.g., the FQHE droplet 46, to a lateral region of the 2D quantum well. The applied voltages can also be used to manipulate the edges of such a laterally confined droplet of the 2DCCG. For example, if the charge carriers of the 2DCCG are electrons, increasing the magnitude of the negative voltage applied to one or more of the top electrodes 42A, 42B, 42C, 42D, 44A, 44B will increase the local depletion of trapped electrons near the one or more of the top electrodes 42A, 42B, 42C, 42D, 44A, 44B on which the magnitude of the applied negative voltage was increased. Thus, increasing magnitudes of applied negative voltages will move the edges of such a laterally confined FQHE droplet 46 of electrons further lateral from the top electrode(s) 42A, 42B, 42C, 42D, 44A, 44B on which the magnitude(s) of the applied negative voltage(s) is/are increased.

In various embodiments, the three pairs of top electrodes, i.e., pairs (42A, 42B), (42C, 42D), and (44A, 44B) are separately biased, to enable independent control of different properties of a FQHE droplet 46. The top lateral confining electrodes 44A, 44B control the size of the part of the FQHE droplet 46 confined to a lateral cavity C1 that is substantially surrounded by the electrodes 42A, 42B, 42C, 42D, 44A, 44B. That is, varying the voltage bias to the top lateral confining electrodes 44A, 44B can move the upper and lower lateral boundaries and area of the part of the FQHE droplet 46 that is confined to the central lateral cavity C1. The top gating electrodes 42A, 42B control the lateral width of a channel 48 of the FQHE droplet 46 that connects the part of the FQHE droplet 46 that is confined to the central lateral cavity C1 with the part of the FQHE droplet 46 that is confined to the left lateral cavity L in FIG. 4A. The top electrodes 42C, 42D control the lateral width of a channel 50 of the FQHE droplet 46 that connects the part of the FQHE droplet 46 that is confined to the central lateral cavity C1 with the part of the FQHE droplet 46 that is confined to the right lateral cavity R in FIG. 4A.

The voltage applied to each pair of top gating electrodes, i.e., pairs (42A, 42B) and (42C, 42D), can also control the probability that edge excitations on the FQHE droplet 46 will tunnel between the upper edge C-A and lower edge B-D of the FQHE droplet 46 in FIG. 4A. In particular, when the width of one of the channels 48, 50, which connects the part of the FQHE droplet 46 in the central lateral cavity C1 to the part of the FQHE droplet 46 in the left or right lateral cavities L, R, is reduced, edge excitations of the FQHE droplet 46 that approach the one of the channels 48, 50 can be back scattered. Such back scattering can make such an edge excitation tunnel to the opposite edge of the FQHE droplet 46 and reverse its generally rightwards or leftwards direction of propagation in FIG. 4A. Thus, the voltage at each pair of top gating electrodes (42A, 42B) and (42C, 42D) may be set to either cause such back scatterings of edge excitations to the opposite edges of the FQHE droplet 46 or to forbid such back scatterings.

Based on such back scatterings, the FQHE device 20 can interfere quasiparticle or edge excitations of the FQHE droplet 46. For example, the two pairs of top gating electrodes, i.e., pairs (42A, 42B) and (42C, 42D), may be set to cause such back scatterings at both channels 48, 50. Then, the edge or excitations incoming from the left on the lower edge of the FQHE droplet 46 can be back scattered at both the left channel 48 and at the right channel 50. Thus, such back scattered edge excitations can interfere on the upper edge of the FQHE droplet 46 in the left lateral cavity L. The form of such interference may be varied by changing the area of the part of the FQHE droplet confined to the central lateral cavity C1, e.g., by varying the voltage applied to the top confining electrodes 44A, 44B. In particular, the wavefunction associated with quasiparticle or edge excitations back scattered at the right channel 50 receives an added phase that is fixed by the number of quasiparticle excitations and magnetic flux quanta in the part of the FQHE droplet 46 that is confined in the central lateral cavity C1. Thus, changing the area of said centrally confined part of the FQHE droplet 46 via the voltage applied to the lateral confining electrodes 44A, 44B can change the interference between such back scatterings of edge or quasiparticle excitations at the two channels 48, 50.

Figure 4B:
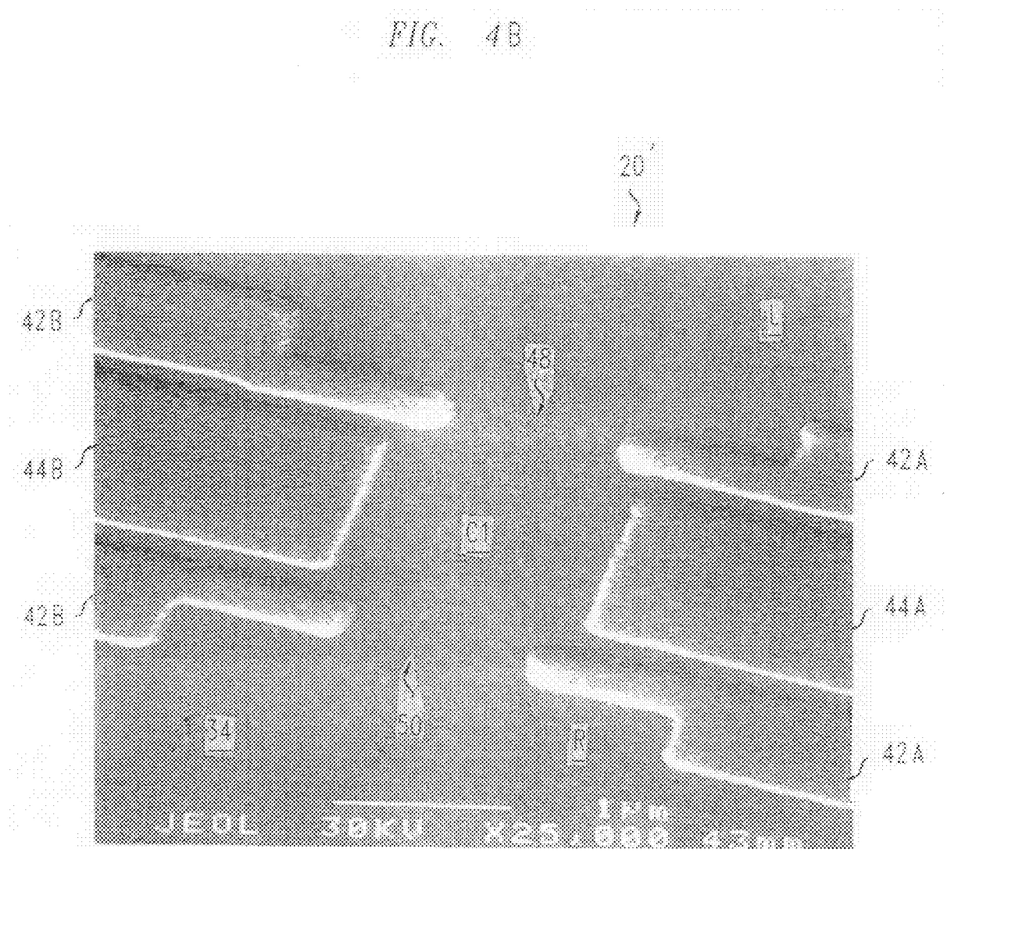
FIG. 4B is an electro micrograph showing an oblique view of one specific embodiment of the planar structure of FIG. 4A.

FIG. 4B is an electron micrograph of one specific embodiment 20' of the FQHE device 20 of FIG. 4A. The specific FQHE device 20' has the layer structure of FIGS. 2-3, i.e., the layer structure with an AlGaAs/GaAs/AlGaAs 2D quantum well. The electron micrograph shows the top electrodes 42A-42D and 44A-44B, which are located on the dielectric layer 34, i.e., a silicon nitride layer. The top electrodes 42A-42D and 44A-44B substantially surround a central lateral cavity C1 whose area is about 2 $\mu m^2$. The top gating electrodes (42A, 42B) and (42C, 42D) have widths of about 1 $\mu m$, and the opposing distal tips of each pair of said top gating electrodes (42A, 42B) and (42C, 42D) are separated by a gap of about 0.6 $\mu m$. At low temperatures, the FQHE device 20' can interfere edge excitations back scattered at the channels 48, 50 and can be used to indicate the presence of quasiparticles of charge e/2 and e/4 in the FQHE fluid 46 for a Landau level filling factor of 5/2.

Figure 5A:
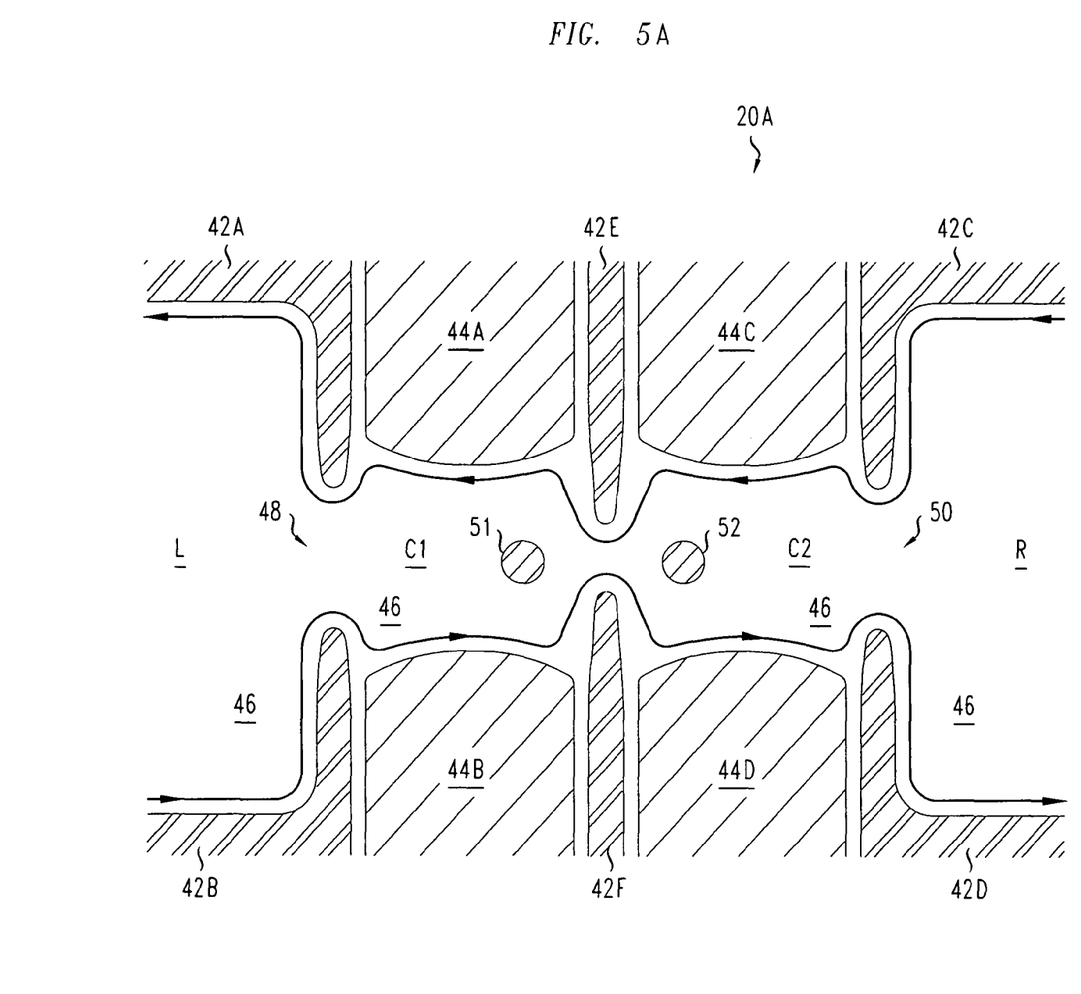
FIGS. 5A, 5B, and 5C are top views of alternate embodiments of planar structures that enable manipulating excited states of a FQHE fluid, e.g., with the setup of FIG. 1.
Figure 5B:
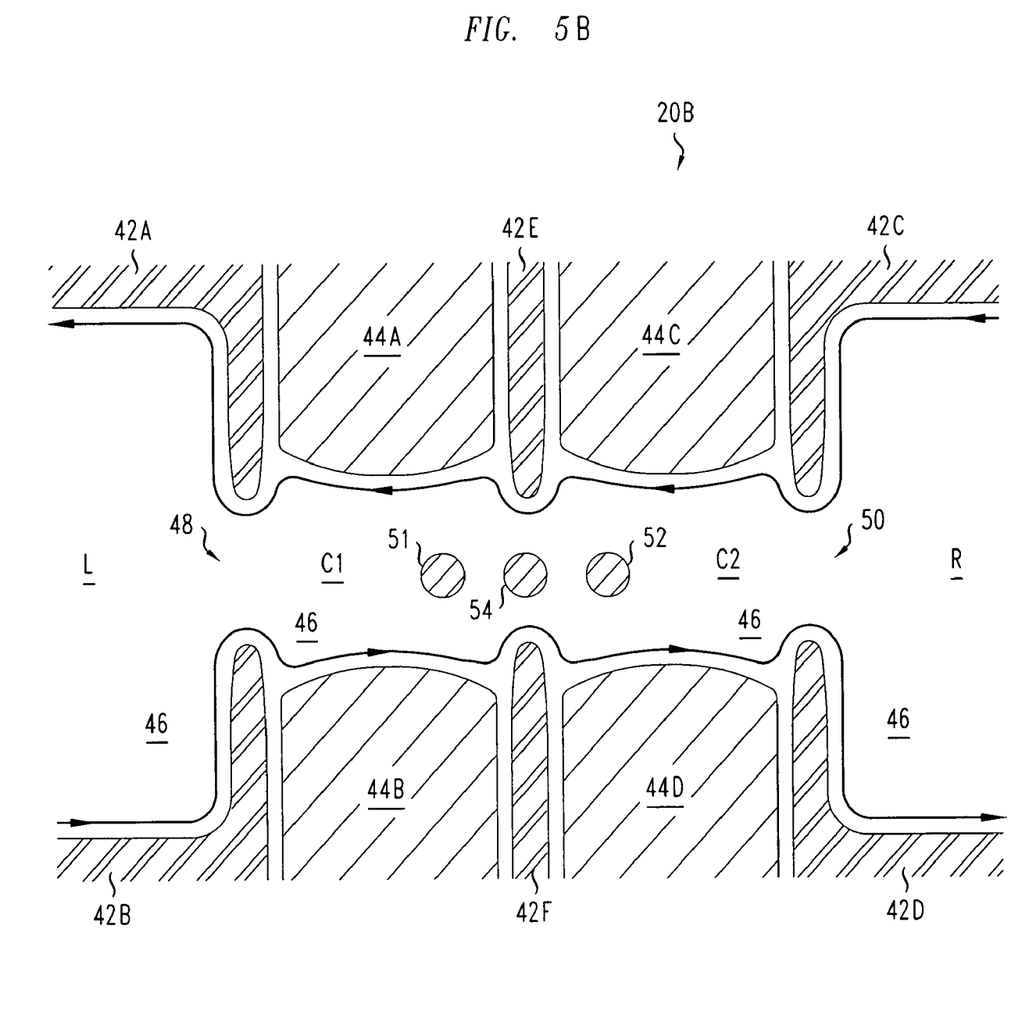
Figure 5C:
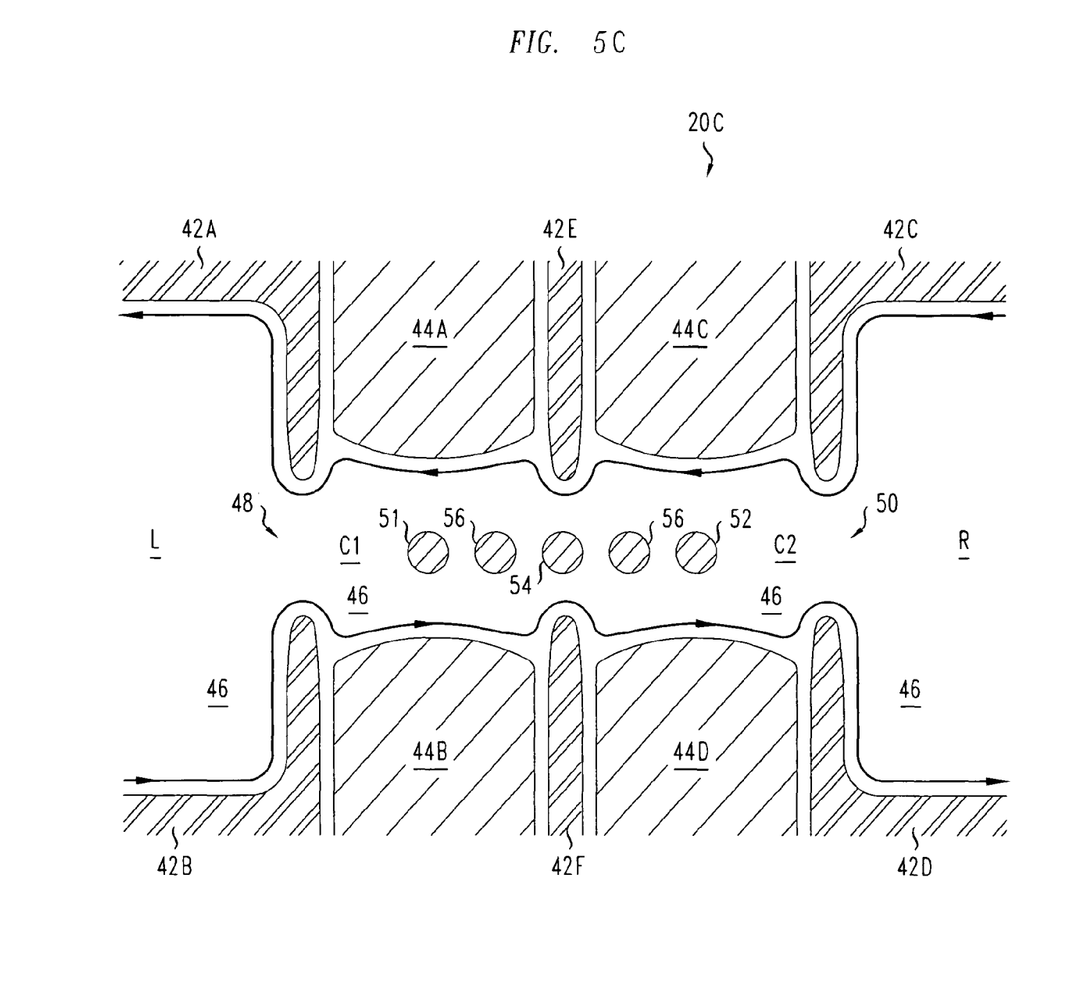

FIGS. 5A-5C show alternate FQHE devices 20A-20C having the planar structure 18 of FIG. 1. The planar FQHE devices 20A-2C are able to produce and manipulate a laterally confined FQHE droplet 46 of a 2DCCG that is trapped in a 2D quantum well when the 2DCCG is subject to a strong transverse magnetic field, B, at very low temperatures, e.g., in the setup 10 of FIG. 1. The planar FQHE devices 20A-20C have 2D quantum well structures with the layer structure of FIG. 6.

Each of the FQHE devices 20A-20C is configured to provide separate control of two laterally confined portions of the FQHE droplet 46 of the 2DCCG. The first laterally confined portion of the FQHE droplet 46 is substantially surrounded by the top electrodes 42A, 42B, 44A, 44B, 42E, 42F and is confined in the first central lateral cavity C1. The second lateral portion of the FQHE droplet 46 is substantially surrounded by the top electrodes 42C, 42D, 44C, 44D, 42E, 42F and is confined in the second central lateral cavity C2. The first pair of top confining electrodes 44A, 44B is separately voltage biased to enable independent control of the area of the portion of the FQHE droplet confined in the first central lateral cavity C1. The second pair of top confining electrodes 44C, 44D is separately voltage biased to enable independent control of the area of the portion of the FQHE droplet 46 confined in the second central lateral cavity C2. The left pair of top gating electrodes 42A, 42B is separately voltage biased to enable independent control of the width of a channel 48 connecting the portions of the FQHE droplet 46 in the first central lateral cavity C1 and the left lateral cavity L. The second pair of top gating electrodes 42C, 42D is separately voltage biased to enable independent control of the width of a channel 50 connecting the portions of the FQHE droplet 46 in the second central lateral cavity C2 and the right lateral cavity R. The third pair of top gating electrodes 42E, 42F is also separately voltage biased to enable independent control of the width of a channel connecting the portions of the FQHE droplet 46 laterally confined in the first and second central lateral cavities C1, C2.

Notably, the FQHE devices 20A-20C also include a top localized or point-like electrode 51, 52 in each of the first and second central lateral confining regions C1, C2. Each top point-like electrode 51, 52 can be separately voltage biased in a manner configured to hold a quasiparticle excitation, e.g., a composite fermion excitation, locally at the point-like electrodes 51, 52. For example, at the Landau level filling factor of 5/2, the point-like electrodes may be biased with voltages that correspond to quasiparticle excitations with charges e/2 or e/4 being localized there about.

Herein, a top point-like electrode, e.g., the top point-like electrodes 51, 52, is an electrode whose tip region is surrounded by a lateral cavity, e.g., the cavities C1 and C2, in which a portion of a FQHE fluid droplet may be laterally confined and whose tip region has an area that is substantially smaller than the area of said lateral cavity. The area of the tip region of such a point-like electrode may be, e.g., two or more times as small or five or more times as small as the area of the surrounding lateral cavity.

In FIGS. 5B and 5C, the FQHE devices 20B-20C also include one or more top bridging electrodes 54, 56 between the top point-like electrodes 51, 52 and near the distal tips of the top gating electrodes 42E, 42F. The top bridging electrodes 54, 56 are located in positions that complete a first path for quasiparticle or edge excitations propagating between the point-like electrodes 51, 52 and also complete a second path for quasiparticle or edge excitations propagating between the upper and lower edges of the FQHE droplet 46 near the distal tips of the third pair of top gating electrodes 42E, 42F.

The one or more top bridging electrodes 54, 56 can facilitate control of whether quasiparticle or edge excitations propagate between the top point-like electrodes 51, 52 or propagate between the upper and lower edges of the FQHE droplet 46 near the third pair of top gating electrodes 42E, 42F. To selectively transfer a quasiparticle or edge excitation between the top point-like electrodes 51, 52, the top gating electrodes 42E, 42F may be maintained at voltages for which the upper and lower edges of the FQHE droplet 46 are far from the one or more top bridging electrode(s) 54, 56. In such a state, a quasiparticle or edge excitation may tunnel between the top point-like electrodes 51, 52, but typically will have, at most, a very low of tunneling probability between the upper and lower edges of the FQHE droplet 46 near the third pair of top gating electrodes 42E, 42F. To selectively transfer a quasiparticle or edge excitation between the upper and lower edges of the FQHE droplet 46 near the third pair of top gating electrodes 42E, 42F, the third pair of top gating electrodes 42E, 42F may biased at a voltage for which the upper and lower edges of the FQHE droplet 46 are near one or more of the top bridging electrodes 54, 56. In such a state, a quasiparticle or edge excitation may tunnel between the upper and lower edges of the FQHE droplet 46 near the third pair of top gating electrodes 42E, 42F whereas a quasiparticle or edge excitation may have a very low probability to tunnel between the top point-like electrodes 51, 52.

The top bridging electrodes 54, 56 may aid in selecting between different paths for quasiparticle or edge excitation transfers for several reasons.

First, the presence of one or more of the top bridging electrodes 54, 56 may reduce the largest distance that a quasiparticle or edge excitation must tunnel in one jump while being transferred between the two top point-like electrodes 51, 52.

Second, the presence of one or more of the top bridging electrodes 54, 56 may produce geometries where a quasiparticle or edge excitation transfer between the top point-like electrodes 51, 52 involves tunnelings over shorter distances than the tunneling of a quasiparticle or edge excitation between the upper and lower edges of the FQHE droplet 46 near the third pair of top gating electrodes 42E, 42F.

Third, the presence of one or more of the top bridging electrodes 54, 56 may enable applications of bias voltages that aid in transferring quasiparticle or edge excitations between the top point-like electrodes 51, 52. For example, during such a left-to-right transfer, when a quasiparticle or edge excitation is at the middle top bridging electrode 54, the left top-bridging electrode 56 may be voltage-biased to push the excitation towards the right top bridging electrode 56. Also, when the quasiparticle or edge excitation is at the right top bridging electrode 56, the middle top bridging electrode 54 may be voltage-biased to push the quasiparticle or edge excitation towards the right top point-like electrode 52. Similarly, during a right-to-left transfer, the right top bridging electrode 56 may be voltage biased to push a quasiparticle or edge excitation from the middle top bridging electrode 54 towards the left top bridging electrode 56. Also, when the quasiparticle or edge excitation is at the left top bridging electrode 56, the middle top bridging electrode 54 may be voltage biased to push the quasiparticle or edge excitation towards the left top point-like electrode 51.

The top bridging electrodes 54, 56 may both aid in selecting between the paths for transferring quasiparticle or edge excitations and aid in reducing the time needed for such transfers.

Figure 6:
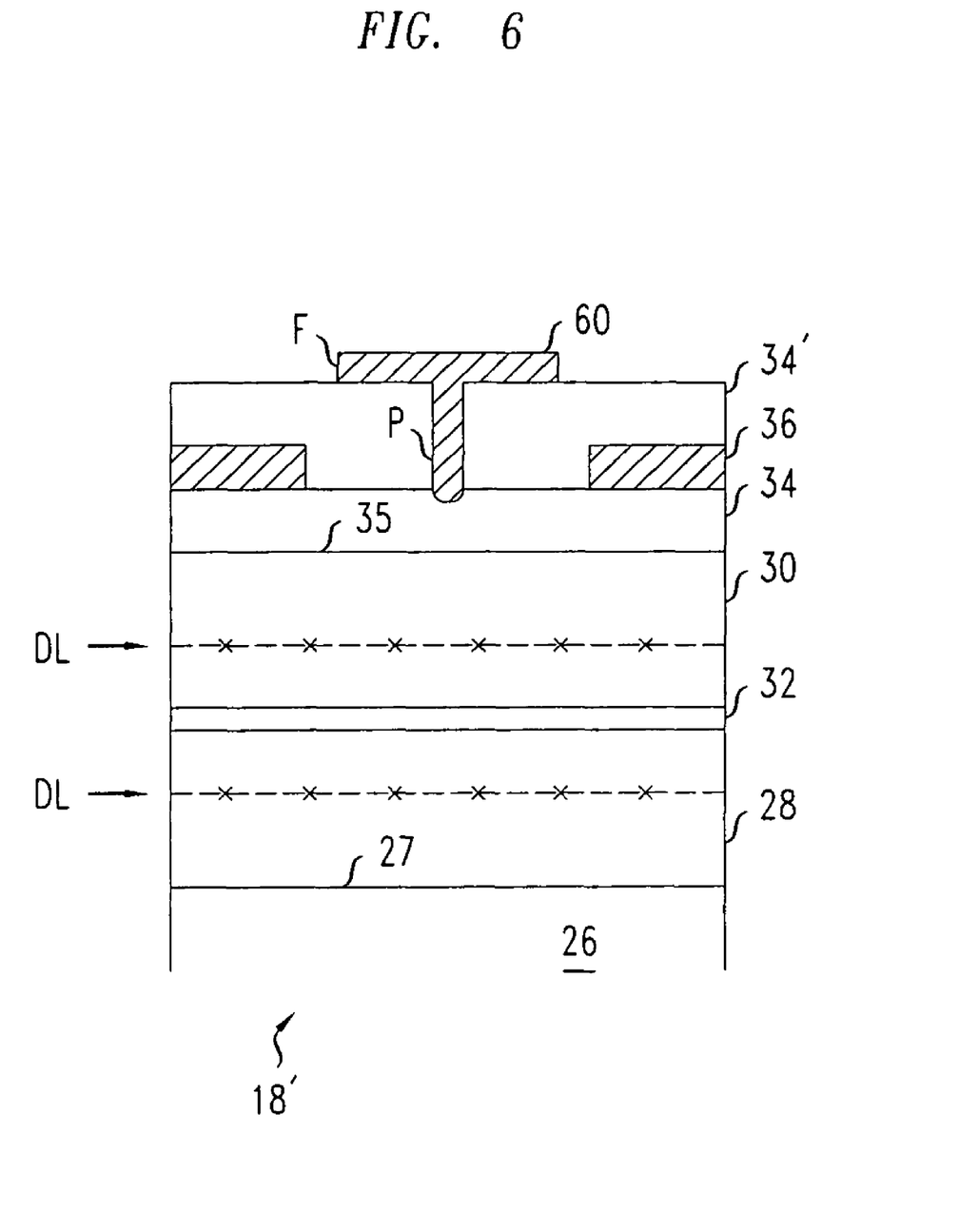
FIG. 6 is a cross-sectional view illustrating an example layer structure for the planar structure of FIGS. 5A-5C.

FIG. 6 schematically illustrates the layer structures of the planar FQHE devices 20A-2C of FIGS. 5A-5C. The layer structures of the FQHE devices 20A-2B are the same as layer structures illustrated in FIG. 2-3 except for additions of features that implement the top point-like and bridging electrodes 51, 52, 54, 56 in FIGS. 5A-5C.

The first additional feature involves the presence of top electrodes 60, which function as the top point-like electrodes 51, 52 and optionally the one or more top bridging electrodes 54, 56. Each top electrode 60 has, e.g., a flat portion (F) and a point-like portion (P) that projects downward towards the underlying 2D quantum well structure.

The second additional feature is a second dielectric layer 34' located on the first dielectric layer 34. The flat portions F of the top electrodes 60 rest on the second dielectric layer 34', and the point-like projections P of the top electrodes 60 project into holes etched into the second dielectric layer 34'. For that reason, the thickness of the second dielectric layer 34' may be fixed by the length of the point-like projections P.

The second dielectric layer 34' may have the same dielectric composition as the first dielectric layer 34 or may have a different dielectric composition. It may be useful to construct the first and second dielectric layers 34, 34' with different dielectric compositions, e.g., silicon nitride and silicon dioxide, respectively, so that the first dielectric layer 34 can function as an etch stop when the second dielectric layer 34' is etched to produce holes for the point-like projections P.

Figure 7:
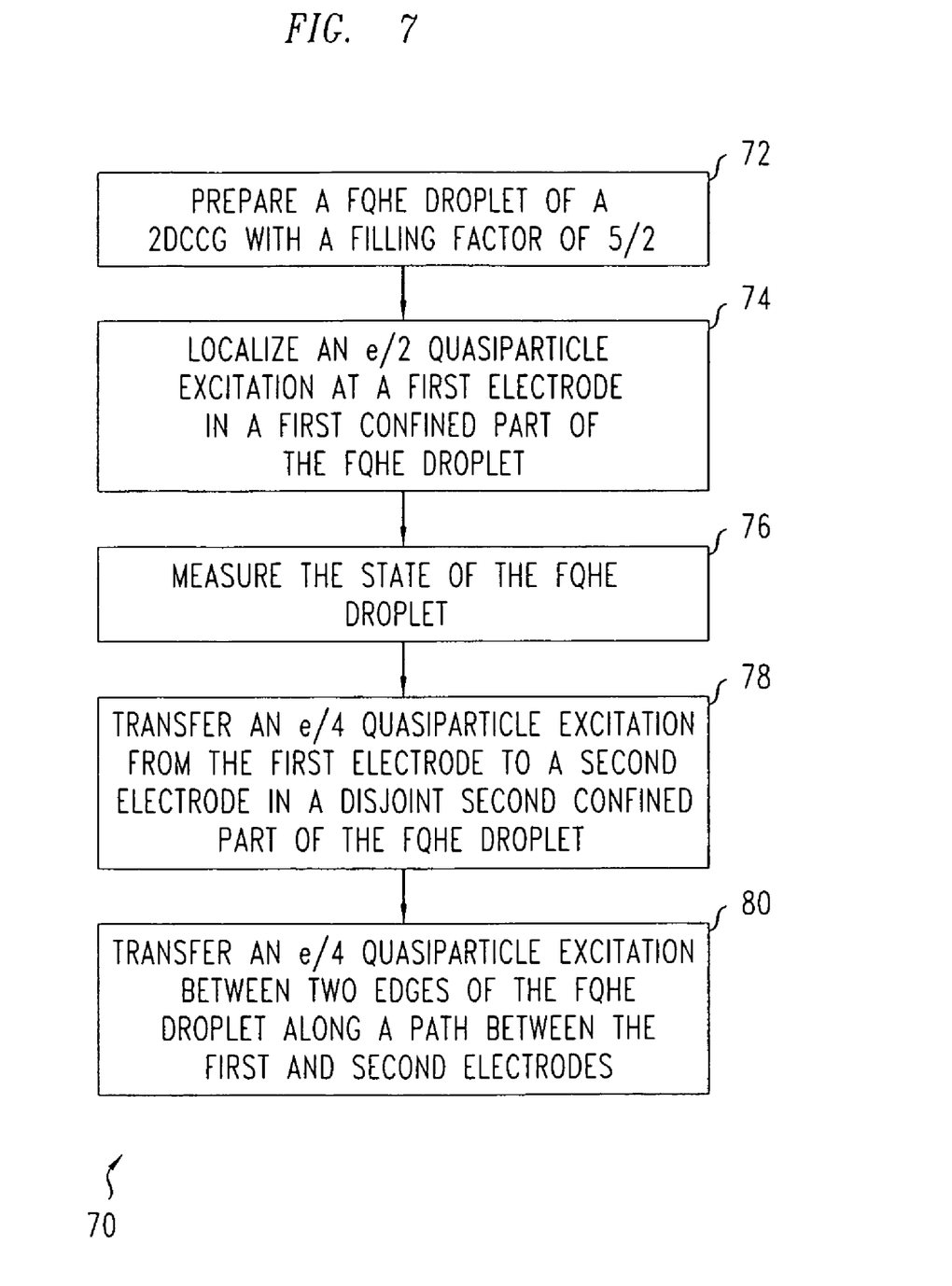
FIG. 7 is a flow chart schematically illustrating a method for manipulating excited states of a FQHE fluid droplet, e.g., using the planar structures of FIGS. 2, 4A-4B, 5A-5C, and/or 6 in the setup of FIG. 1.

FIG. 7 schematically illustrates a method 70 for operating a FQHE device with a 2D quantum well structure and two lateral confining regions, e.g., the FQHE devices 20A-20C with the lateral confining regions C1, C2 as illustrated in FIGS. 5A-5C. The method 70 involves steps for initializing and manipulating a topological state of a FQHE droplet at a Landau level filling factor of about 5/2. For example, the method 70 may be performed to store and/or change a qubit's state in a quantum computer. The 2D quantum well structure may be modulation doped, e.g., as illustrated in FIGS. 2 and 6.

The method 70 includes preparing a laterally confined FQHE droplet, e.g., the FQHE droplet 46, from a 2DCCG that is trapped in a 2D quantum well structure such that the 2DCCG has a Landau level filling factor ν of 5/2 in the FQHE droplet (step 72). The filling factor ν is, e.g., $\rho hc/(|eB|)$ where h is Planck's constant, e is the electron charge, c is the speed of light, B is the magnetic field strength, and ρ is the density of trapped charge carriers in the laterally confined part of 2DCCG in the 2D quantum well structure, e.g., in the central cavities C1 and C2.

The preparing step 72 includes cooling and subjecting the trapped 2DCCG to a sufficiently strong magnetic field, B, e.g., with the setup 10 of FIG. 1.

The preparing step 72 involves laterally confining a part of the trapped 2DCCG via electrodes, e.g., the top electrodes 42A-42F, 44A-44D of FIGS. 5A-5C, that charge-deplete lateral regions of the 2D quantum well structure around the part of the 2DCCG being laterally confined, e.g., in the central regions C1 and C2. The electrodes may be located over and electrically insulated from the 2D quantum well structure by a dielectric layer, e.g., the dielectric layer 34 of FIG. 6. The step of laterally confining a FQHE droplet may include appropriately setting the ρ of the confined part of the 2DCCG by charge-depleting part of the edge of said confined droplet.

The method 70 includes voltage-biasing a first electrode in the interior of a first confined part of the FQHE droplet to locally trap a charge e/2 quasiparticle excitation at the first electrode, e.g., at the point-like electrode 51 in the first central lateral cavity C1 of FIGS. 5A-5C (step 74). The voltage-biasing step 74 may initialize the FQHE device to a first state of a qubit representable by the FQHE droplet.

The method 70 may include determining the form of the FQHE state that was produced by trapping the e/2 quasiparticle excitation at the electrode in the interior of the first confined part of the FQHE droplet (step 76). Such determinations may be performed by measuring longitudinal conductances associated with the edge excitations that back scatter between the upper and lower edges of the confined FQHE droplet. In particular, interference between different back scattered edge excitation states will depend on whether the edge excitations do or do not propagate around the confined part of the FQHE droplet where the e/2 quasiparticle excitation is localized. Some such measurements may be described, e.g., in an article published at Physical Review Letters, vol. 94 (2005) pages 166802-1 to 166802-4. Said article is incorporated herein by reference in its entirety.

The method 70 includes transferring an e/4 quasiparticle excitation from the first electrode to a second electrode that is located in a disjoint second confined part of the FQHE droplet, e.g., at the top point-like electrode 52 in the second central lateral cavity C2 of FIGS. 5A-5C (step 78). The transferring step 78 may include changing the voltage-biasing of the first and second electrodes. The transfer step 78 leaves a charge e/4 quasiparticle excitation at the first electrode. The transferred e/4 quasiparticle may be, e.g., held under a tip of the other top point-like electrode 51, 52 of FIGS. 5A-5C.

The transferring step 76 may include changing bias voltages at one or more top bridging electrodes, e.g., one or more of the top bridging electrodes 54, 56 of FIGS. 5B-5C to aid in transferring the e/4 excitation. For example, the e/4 quasiparticle may be temporally held by such bridging electrode(s) 54, 56 during part of its transfer.

The method 70 includes changing the voltage-biasing of one or more of the top gating electrodes, e.g., the top gating electrodes 44E, 44F of FIGS. 5A-5C, controlling a region between the first and second electrodes so that a charge e/4 quasiparticle or edge excitation back scatters between upper and lower edges of the FQHE droplet (step 80).

At the step 80, the back scattering of the e/4 quasiparticle or edge excitation involves its propagation around one of the localized e/4 quasiparticle excitations that is held at one of the first and second electrodes, but does not involve a propagation of said e/4 quasiparticle or edge excitation around the other localized e/4 quasiparticle excitation that is held at the other of the first and second electrodes. For example, the back scattering may occur between portions of the edges of the FQHE droplet near the top gating electrodes 42E and 42F in FIGS. 5A-5C.

At the step 80, the transferring of the e/4 quasiparticle between the two edges of the FQHE droplet may be performed with the aid of a top bridging electrode, e.g., the top bridging electrode 54 of FIGS. 5B-5C, and may change, e.g., the state of a qubit stored by the FQHE device.

The invention is intended to include other embodiments that would be obvious to one of skill in the art in light of the description, figures, and claims.

What we claim is:

1. An apparatus comprising:
a substrate having a planar top surface;
a multilayer of semiconductor layers located on the planar surface, the multilayer including a 2D quantum well;
a plurality of electrodes located over the multilayer, a first set of the electrodes being located to substantially surround a lateral area of the 2D quantum well; and
a dielectric layer located between the electrodes and the multilayer; and
wherein a second set of the electrodes is controllable to vary a lateral width of a non-depleted channel between the substantially surrounded lateral area of the 2D quantum well and another area of the 2D quantum well, a third set of the electrodes is controllable to vary an area of a non-depleted portion of the lateral area.

2. The apparatus of claim 1, wherein the 2D quantum well has a well layer located more than 100 nm from a nearest surface of the multilayer.

3. The apparatus of claim 1, wherein the plurality of electrodes includes, at least, two point-like electrodes.

4. The apparatus of claim 1, wherein the second set of the electrodes can back scatter an edge current propagating along one edge of a FQHE droplet to an opposite edge of said FQHE droplet.

5. The apparatus of claim 1, wherein a fourth set of the electrodes is located to substantially surround a second lateral area of the 2D quantum well, the two lateral areas being disjoint, some of the electrodes being controllable to vary a lateral width of a non-depleted channel between the two lateral areas.

6. The apparatus of claim 1, wherein the electrodes includes one point-like electrode located in each of the lateral areas.

7. The apparatus of claim 6, wherein the electrodes includes a bridge electrode located between the point-like electrodes and between a pair of gating electrodes.

8. The apparatus of claim 7, wherein the bridge electrode are operable to transport a localized FQHE excitation between the point-like electrodes.

9. The apparatus of claim 7, wherein the bridge electrode is operable to transport a localized FQHE excitation between the point-like electrodes.

10. The apparatus of claim 7, wherein the bridge electrode includes a plurality of electrodes between the point-like electrodes.

11. The apparatus of claim 6, wherein the plurality of electrodes includes a bridge electrode located between the point-like electrodes and between a pair of gating electrodes.

12. The apparatus of claim 1, wherein the 2D quantum well comprises AlGaAs barrier layers and a GaAs well layer located between the barrier layers.

13. The apparatus of claim 1, wherein a well layer and adjacent portions of the barrier layers of the 2D quantum well are substantially undoped.

* * * * *